(12) United States Patent
Zmood et al.

(10) Patent No.: US 11,695,402 B2
(45) Date of Patent: Jul. 4, 2023

(54) EFFICIENT SWITCHING CIRCUIT

(71) Applicant: Solaredge Technologies Ltd., Herzeliya (IL)

(72) Inventors: Daniel Zmood, Ness Ziona (IL); Tzachi Glovinsky, Petah Tikva (IL)

(73) Assignee: Solaredge Technologies Ltd., Herzeliya (IL)

( * ) Notice: Subject to any disclaimer, the term of this patent is extended or adjusted under 35 U.S.C. 154(b) by 0 days.

(21) Appl. No.: 17/747,114

(22) Filed: May 18, 2022

(65) Prior Publication Data
US 2022/0345124 A1  Oct. 27, 2022

Related U.S. Application Data

(63) Continuation of application No. 16/795,653, filed on Feb. 20, 2020, now Pat. No. 11,374,562, which is a continuation of application No. 15/984,516, filed on May 21, 2018, now Pat. No. 10,608,624.

(60) Provisional application No. 62/510,838, filed on May 25, 2017.

(51) Int. Cl.
| | |
|---|---|
| *H03K 17/06* | (2006.01) |
| *H03K 17/567* | (2006.01) |
| *H03K 17/10* | (2006.01) |
| *H03K 17/16* | (2006.01) |
| *H03K 17/12* | (2006.01) |
| *H03K 17/687* | (2006.01) |

(52) U.S. Cl.
CPC ......... *H03K 17/063* (2013.01); *H03K 17/102* (2013.01); *H03K 17/164* (2013.01); *H03K 17/567* (2013.01); *H03K 17/122* (2013.01); *H03K 17/6871* (2013.01); *H03K 2217/0036* (2013.01); *H03K 2217/0054* (2013.01)

(58) Field of Classification Search
None
See application file for complete search history.

(56) References Cited

U.S. PATENT DOCUMENTS

| | | | | |
|---|---|---|---|---|
| 4,178,605 | A | * 12/1979 | Hsu | H01L 27/0883 257/373 |
| 5,155,289 | A | 10/1992 | Bowles | |
| 5,565,375 | A | * 10/1996 | Hiser | H01L 27/088 257/E27.06 |
| 6,111,390 | A | 8/2000 | Inaba et al. | |
| 6,118,311 | A | 9/2000 | Kamiya | |
| 6,118,324 | A | 9/2000 | Li et al. | |
| 6,249,111 | B1 | 6/2001 | Nguyen | |
| 7,034,575 | B2 | 4/2006 | Gallo et al. | |
| 7,230,470 | B1 | 6/2007 | You et al. | |

(Continued)

OTHER PUBLICATIONS

Sep. 28, 2018—EP Search Report for EP App 18174053.1.
Jan. 20, 2023—CN Notice of Allowance—CN App No. 201810491782. 1.

*Primary Examiner* — Thomas J. Hiltunen
(74) *Attorney, Agent, or Firm* — Banner & Witcoff, Ltd.

(57) ABSTRACT

An apparatus includes a first leg having a plurality of transistors connected in series between a first node and a second node. Each of the plurality of transistors includes a respective body diode. The apparatus further includes a second leg connected between the first node and the second node and in parallel to the series connection of the plurality of transistors of the first leg. The second leg includes a first transistor. The second leg has lower reverse recovery losses relative to the first leg.

20 Claims, 6 Drawing Sheets

(56) References Cited

U.S. PATENT DOCUMENTS

| | | |
|---|---|---|
| 7,279,931 B2 | 10/2007 | Lee et al. |
| 7,391,133 B1 | 6/2008 | Hennessy et al. |
| 7,741,883 B2 | 6/2010 | Fuller et al. |
| 8,030,906 B2 | 10/2011 | Jo et al. |
| 8,716,893 B2 * | 5/2014 | Asplund ............. H03K 17/107 |
| | | 307/37 |
| 8,791,662 B2 | 7/2014 | Tanaka |
| 8,947,951 B2 | 2/2015 | Baeck et al. |
| 8,994,442 B2 | 3/2015 | Konstantinov |
| 9,362,827 B2 | 6/2016 | Chang |
| 9,571,086 B1 | 2/2017 | Romas, Jr. et al. |
| 9,627,973 B2 | 4/2017 | Shibata et al. |
| 9,722,483 B2 * | 8/2017 | Zuniga ................. H02M 1/088 |
| 9,722,581 B2 | 8/2017 | Zhao et al. |
| 10,033,378 B2 | 7/2018 | Turvey |
| 10,411,694 B2 | 9/2019 | Cairoli et al. |
| 10,536,094 B2 | 1/2020 | Zmood et al. |
| 10,608,624 B2 | 3/2020 | Zmood et al. |
| 11,374,562 B2 * | 6/2022 | Zmood ................ H03K 17/102 |
| 2003/0038615 A1 | 2/2003 | Elbanhawy |
| 2011/0273219 A1 | 11/2011 | Marotta et al. |
| 2012/0057387 A1 | 3/2012 | Lai et al. |
| 2012/0126317 A1 * | 5/2012 | Ng ...................... H01L 27/0727 |
| | | 438/237 |
| 2012/0268091 A1 | 10/2012 | Takemae |
| 2013/0162023 A1 | 6/2013 | Watanabe |
| 2018/0183427 A1 | 6/2018 | Nakajima et al. |
| 2018/0367133 A1 | 12/2018 | Yano et al. |

* cited by examiner

EFFICIENT SWITCHING CIRCUIT

RELATED APPLICATIONS

This application is a continuation of U.S. non-provisional application Ser. No. 16/795,653, filed Feb. 20, 2020, which is a continuation of U.S. non-provisional application Ser. No. 15/984,516, filed May 21, 2018, which claims priority to U.S. provisional application Ser. No. 62/510,838, filed May 25, 2017, entitled "Efficient Switching Circuit," the contents of which are incorporated herein by reference for all purposes.

BACKGROUND

In certain circuits, it is sometimes desirable to serially connect a plurality of transistors to from an equivalent switch having an increased effective voltage blocking capability. Series connection of insulated-gate bipolar transistors (IGBTs) and other high voltage switches have been used in series connection for medium and high voltage applications, which generally entails utilizing some means of static and dynamic balancing of the voltages across the devices to ensure reliable operation, which effectively add losses to the system, and therefore are generally applied to low-frequency switching applications. There is a need for and it would be advantageous to have arrangements of low-voltage switches (e.g., low-voltage MOSFETs) and methods of operation of the low-voltage switches to enable cost effective, efficient switching at high-frequency.

SUMMARY

The following summary may be a short summary of some of the inventive concepts for illustrative purposes only, and may be not intended to limit or constrain the inventions and examples in the detailed description. One skilled in the art will recognize other novel combinations and features from the detailed description.

Embodiments disclosed herein may include low-voltage switch arrangements and methods for operation thereof. Illustrative embodiments include employing stacked (i.e., serially-connected) low-voltage (LV) metal-oxide-semiconductor field-effect transistors (MOSFETs) to form an equivalent switch having an increased voltage blocking capability. In some embodiments, the low-voltage MOSFETs (LVMs) are oriented to block a voltage in one direction, and in some embodiments the LVMs are oriented to block a voltage in two directions.

In some embodiments, stacked LVMs may form a first switch leg, with a second switch leg connected in parallel to the first switch leg. The second switch leg may include one or more switches (e.g., high-voltage MOSFETs (HVMs) and/or IGBTs)). Suitable timing of the switching of the first leg switches and the second leg may reduce switching and conduction losses associated with switching, and may reduce risk of switch breakdown (e.g., due to a large reverse voltage) during switching.

In some embodiments, a third switch leg may be connected in parallel with the first and second legs. The third leg may feature one or more transistors and/or diodes selected to provide efficient reverse recovery during switching of the first and/or second legs.

In some embodiments, a switch circuit having one or more legs may be assembled using discrete components available for individual purchase. In some embodiments, a switch circuit having one or more legs may be assembled and packaged as a single printed circuit board (PCB) or module, with control and power terminals made available outside the assembly. In some embodiments, a switch circuit having one or more legs may be manufactured at the fabrication level (e.g., integrated in silicon).

BRIEF DESCRIPTION OF THE DRAWINGS

These and other features, aspects, and advantages of the present disclosure will become better understood with regard to the following description, claims, and drawings. The present disclosure is illustrated by way of example, and not limited by, the accompanying figures.

DETAILED DESCRIPTION

In the following description of various illustrative embodiments, reference is made to the accompanying drawings, which form a part hereof, and in which is shown, by way of illustration, various embodiments in which aspects of the disclosure may be practiced. It is to be understood that other embodiments may be utilized and structural and functional modifications may be made, without departing from the scope of the present disclosure.

Figure 1:
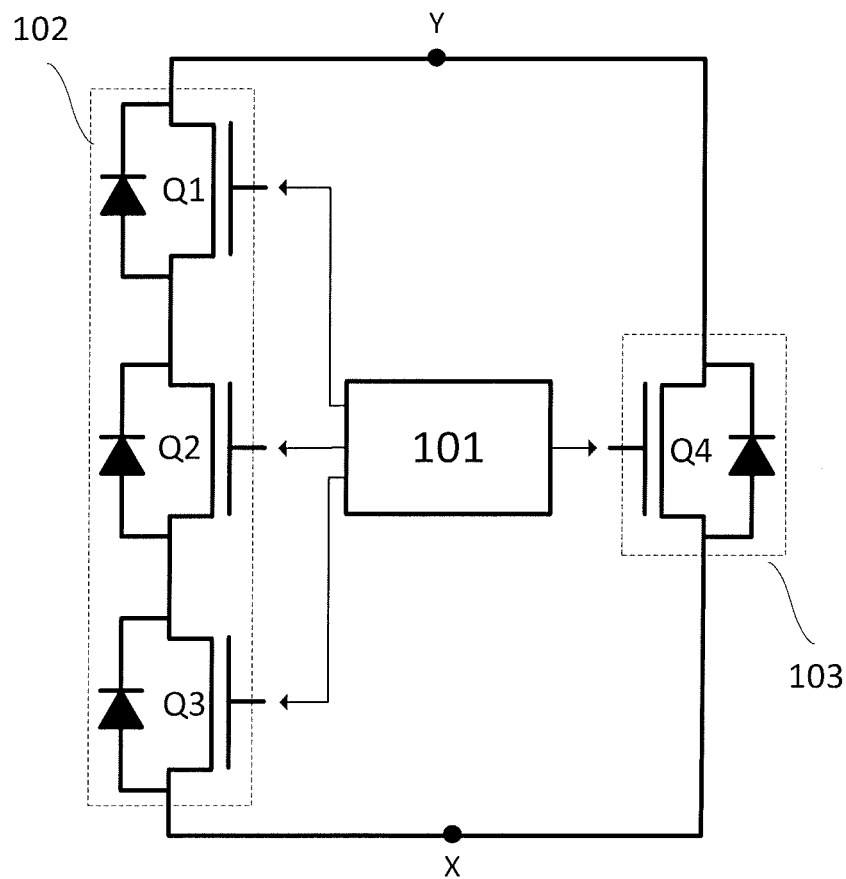
FIG. 1 is part schematic, part block diagram according to one or more illustrative embodiments.

Reference is now made to FIG. 1, which illustrates a switch circuit according to illustrative embodiments. Switch circuit 100 may feature a first leg 102 having switches Q1, Q2 and Q3 connected in series between terminals X and Y. Switches Q1-Q3 may be low-voltage MOSFETs (LVMs), for example, MOSFETs rated to block a drain-to-source voltage of about 100V (e.g. 50V, 80V, 100V, 120V, 150V, 200V, etc.). Switches Q1-Q3 may be stacked (i.e., serially connected) in a source-to-drain configuration, such that the body diodes of switches Q1-Q3 are oriented in the same direction (i.e., the anode of the parasitic diode of switch Q1 is connected to the cathode of the parasitic diode of switch Q2, and the anode of the parasitic diode of switch Q2 is connected to the cathode of the parasitic diode of switch Q3), to increase the voltage blocking capability of first leg 102. For example, if each of switches Q1-Q3 is an 80V switch (i.e., is rated to withstand a voltage of 80V), first leg 102 may have an equivalent rating of 80*3=240V.

Stacking low-voltage switches to achieve a higher voltage rating may provide certain advantaged compared to using a single high-voltage switch. For example, three serially connected 100V MOSFETs may have a total conduction resistance ($R_{ds,on}$) that may be significantly lower than the conduction resistance of a single 250V MOSFET. For example, a single 100V MOSFET may have $R_{ds,on}$=2 m$\Omega$, while a single 250V MOSFET may have $R_{ds,on}$=50 m$\Omega$. Since conduction losses are given by $P_{loss,conduction} = I_{on}^2 \cdot R_{ds,on}$, the conduction losses incurred by serially connected LVMs may be significantly lower than conduction losses incurred by a HVM.

Serially connecting LVMs may present certain challenges when switching the LVMs between states. For example, switches Q1-Q3 are serially connected between terminals X and Y and in the OFF position, and it is desired to switch the switches to the ON state, timing the switching to be simultaneous may be challenging (e.g., because of manufacturing variations between the switches Q1-Q3 which may require three different gate-to-source voltages to drive the three switches to the ON state. Further, a controller may be configured to output three simultaneous control signals, and timing variation might reduce the effectiveness of the control signal. Additionally, timing variation between the control signals may result damage to one or more of the switches. For example, if switches Q1 and Q2 are switched to the ON state before switch Q3, the drain-to-source voltage across switch Q3 may be large (e.g., 200V, above switch Q3's voltage ratings) and may cause damage to switch Q3. Similarly, when switching switches Q1-Q3 from the ON state to the OFF state, timing and/or manufacturing variations may cause damage (e.g., due to avalanche breakdown) to one or more of switches Q1-Q3.

A second leg 103 may be connected in parallel to first leg 102. Second leg 103 may include a high-voltage switch or switches (e.g., a high-voltage MOSFET (HVM), or multiple parallel-connected HVMs which may increase a peak current rating of the second leg) Q4 rated to withstand a full voltage between nodes X and Y. For example, second leg 103 may be rated to withstand 600V. By switching the state of switch Q4 in tandem with switches Q1-Q3, the operational challenges of operating switches Q1-Q3 may be partially or fully alleviated. For example, when switching the state of switch circuit 100 from the OFF state to the ON state, switch Q4 may be switched to the ON state before switches Q1-Q3. By switching the state of switch Q4 before switches Q1-Q3, the voltage stress across switches Q1-Q3 may be significantly reduced (e.g., the voltage stress may be close to 0V), reducing the risk of timing variation causing damage to one of switches Q1-Q3. Furthermore, the switching of switches Q1-Q3 may induce low switching losses due to the low-voltage drop across switches Q1-Q3 during the switching (i.e., near Zero Voltage Switching). After switch Q4 and switches Q1-Q3 are switched ON, switch Q4 may be switched OFF (with switches Q1-Q3 providing a current path), or switch Q4 may remain ON, to provide an additional current path (though switch Q1-Q3 may provide the main current path due to the low $R_{ds,on}$ parameters of switches Q1-Q3).

In some embodiments, switch Q4 may be implemented using a wide gap band transistor, for example, a Silicon Carbide (SiC) or a Gallium Nitride (GaN) transistor. Using a wide gap band transistor may provide enhanced reverse recovery compared to a HV MOSFET.

Switches Q1-Q4 may be controlled by a controller 101. Controller 101 may be or include an analog controller, microprocessor, Digital Signal Processor (DSP), Application-Specific Integrated Circuit (ASIC), and/or a Field Programmable Gate Array (FPGA). Controller 101 may time the switching of switches Q1-Q4 to reduce switching and conduction losses during operation of switch circuit 100.

Figure 2:
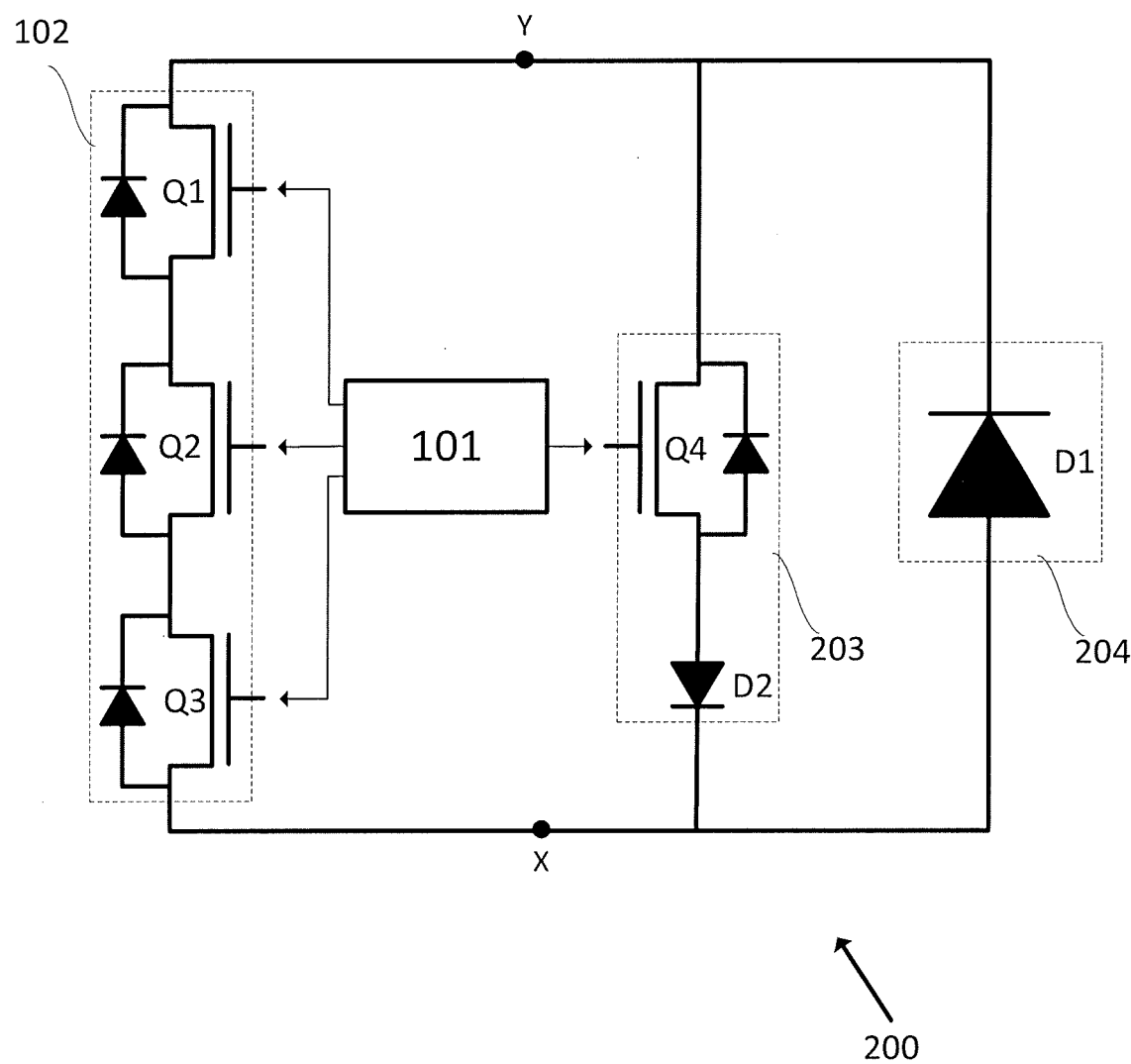
FIG. 2 is part schematic, part block diagram according to one or more illustrative embodiments.

Reference is now made to FIG. 2, which illustrates a switch circuit according to illustrative embodiments. Switch circuit 200 may feature a first leg 102 having switches Q1, Q2 and Q3 connected in series between terminals X and Y. First leg 102 may be the same as first leg 102 of FIG. 1. Second leg 203 may include switch Q4 which may be the same as switch Q4 of FIG. 1, and may further include diode D2 serially connected to switch Q4. Diode D2 may be oriented to prevent current from flowing through the body diode of switch Q4 (which may be desirable where the body diode is low-quality, i.e., lossy). Third leg 204 may include diode D1 disposed such that the cathode of diode D1 is connected (e.g., coupled) to node Y and the anode of diode D1 is connected (e.g., coupled) to node X. Diode D1 may be, for example, a silicon-carbide diode. Diode D1 may have a relatively low conduction voltage, to provide an efficient (e.g., having low-losses) current path between nodes X and Y and to reduce the reverse-recovery energy loss (when switching from ON to OFF) of switch circuit 200.

Figure 3:
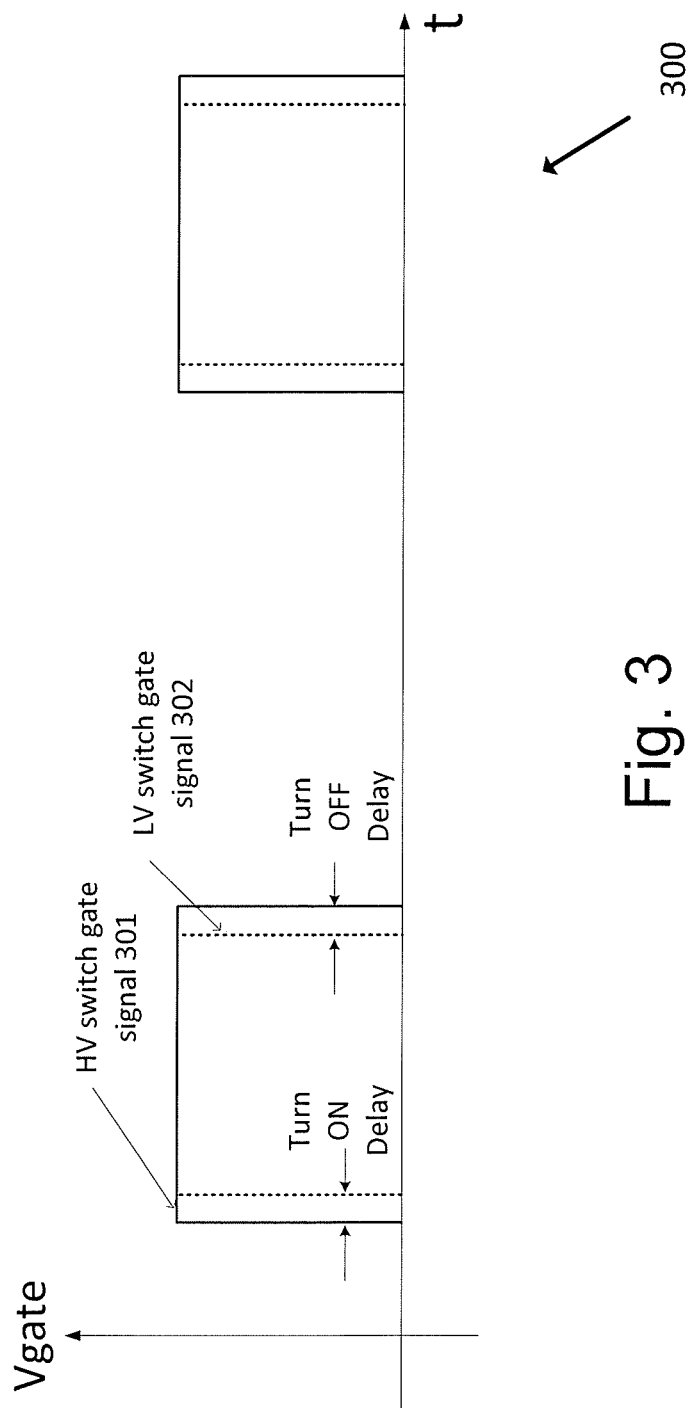
FIG. 3 is a timing diagram according to one or more illustrative embodiments.

Reference is now made to FIG. 3, which illustrates a timing diagram for operating (e.g., via a controller 101 of FIG. 1) a switch circuit, for example, switch circuits 100 (FIG. 1) or 200 (FIG. 2). Timing diagram 300 shows gate voltage signals which may be applied to switches Q1-Q4 of FIG. 1 or FIG. 2. Timing diagram 300 shows a HV switch gate signal 301 and a LV switch gate signal 302. The HV and LV switches may be operated as follows:

a. When switching from OFF to ON, The HV switch (e.g., Q4) may be turned ON, conducting current and reducing the voltage across the LV switches.

b. After a suitably short delay, the LV switches may be turned on and short out the HV switch, providing a significantly lower conduction path for the main current. If the LV switches have an intrinsically larger switching delay than the HV switch, the controller operating the LV and HV switches might not insert any delay.

c. After the required ON time, the LV switches may be turned off and the current may commutate back to the HV switch.

d. Again after a suitable short delay, the HV switch may be switched off and its drain-source voltage may rise.

Figure 4:
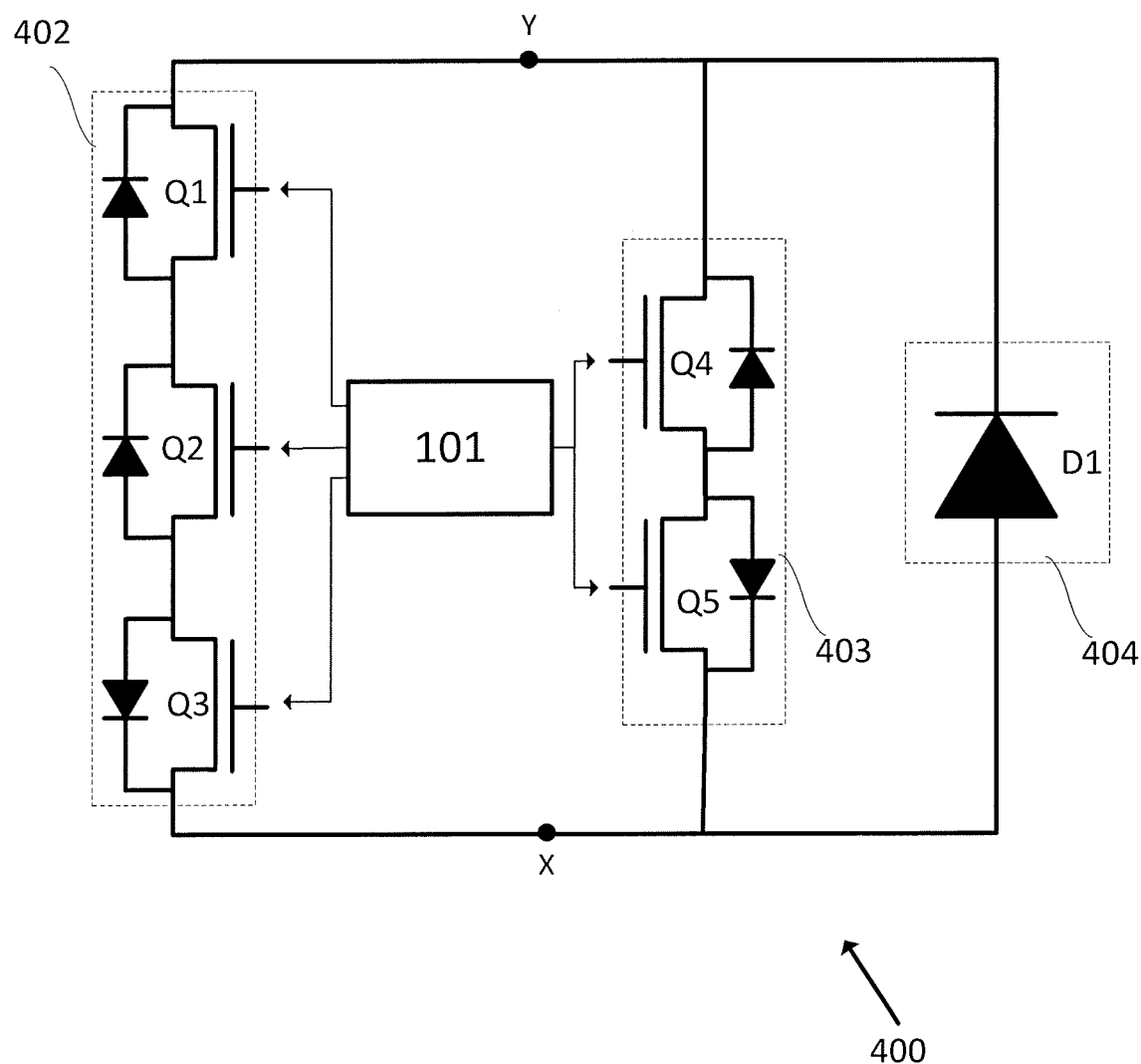
FIG. 4 is part schematic, part block diagram according to one or more illustrative embodiments.

Reference is now made to FIG. 4, which shows a switch circuit 400 according to illustrative embodiments. Switch circuit 400 may comprise a first leg 402, a second leg 403 and a third leg 404. First leg 402 may include a series-connected group of LV switches Q1-Q3. Switches Q1 and Q2 may be oriented in a first direction, and switch Q3 may be oriented in a second direction (e.g., the anodes of switches Q2 and Q3 may be connected to a common node). Switch Q3 may be an LV switch (e.g., having a voltage rating of 80V-120V) or an ultra-LV switch (e.g., may have a voltage rating of about 30V) and may be operated to improve commutation of switch circuit 400 by "forcing" current out of the body diodes of switches Q1 and Q2 when they are operating in rectification mode and into switch Q4 prior to turning switches Q4 and Q5 OFF.

In some embodiments, switch Q3 may be replaced with a diode (e.g., a Schottky diode) connected back-to-back with switch Q1 or with switch Q2, and the diode may similarly serve to prevent current from flowing through the body diodes of switches Q1 and Q2.

Second leg 403 may be connected in parallel to first leg 402 and may feature back-to-back (e.g., having connected anodes) HV switches Q4 and Q5. Switch Q5 may serve to block current from flowing through the body diode of switch Q4 (similarly to diode D2 of FIG. 2). Third leg 404 may be similar to or the same as third leg 204 of FIG. 2, and may comprise diode D1.

First leg 402, second leg 403 and third leg 404 may be controlled by controller 101, which may be the same as or similar to controller 101 of FIG.

Third leg 404 might not be featured in certain embodiments. For example, where the second leg 403 features switches having reasonably high-quality body diodes (e.g., HV Gallium-Nitride (GaN) switches) and/or good reverse recovery characteristics (e.g., low reverse recovery losses).

Figure 5:
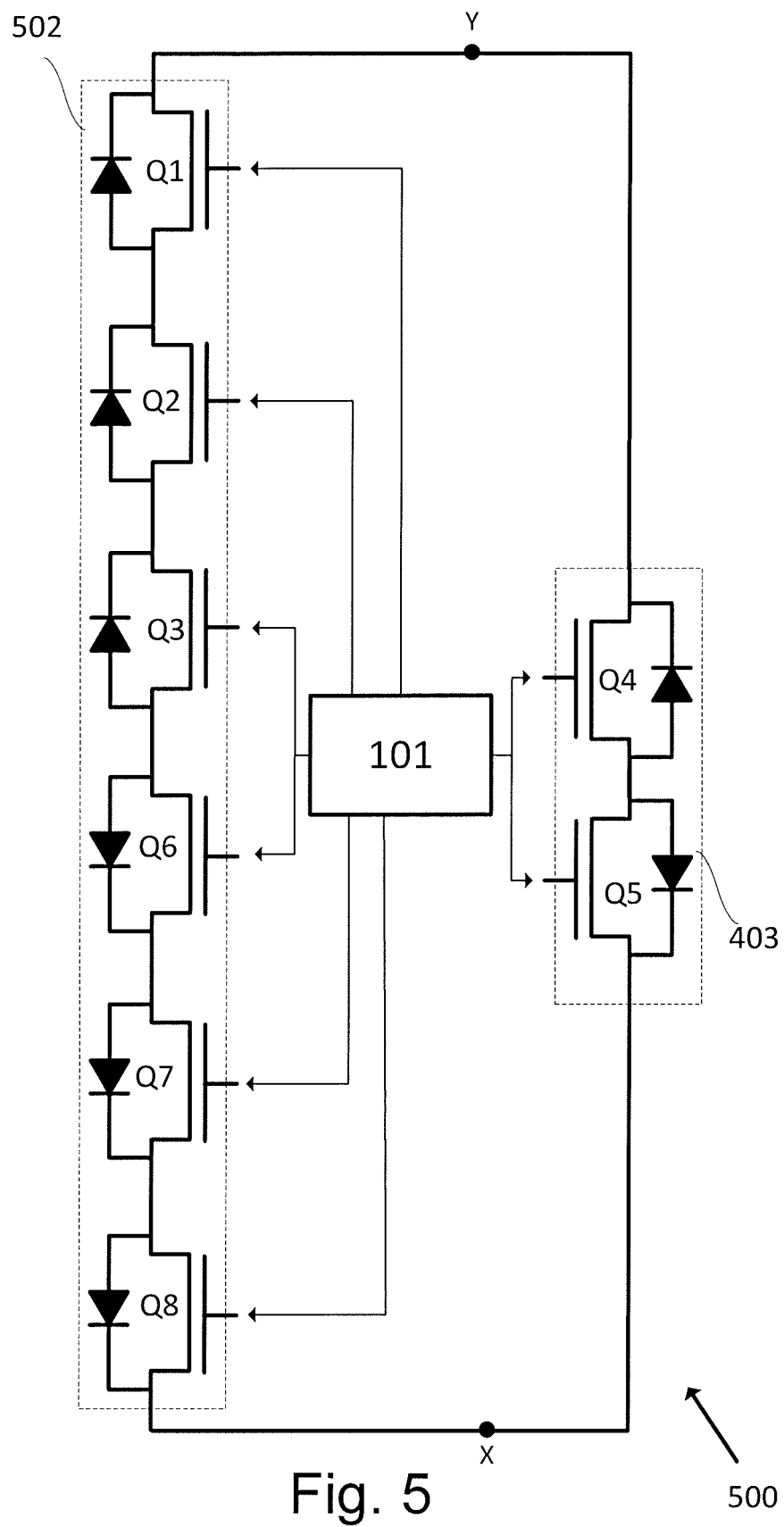
FIG. 5 is part schematic, part block diagram according to one or more illustrative embodiments.

Reference is now made to FIG. 5, which shows a switch circuit 500 according to illustrative embodiments. Switch circuit 500 may be a bidirectional switch circuit, designed and operated to allow controlling current flow from node X to node Y and/or from node Y to node X. First leg 502 may include a first series-connected group of LV switches Q1-Q3 oriented in a first direction (e.g., having body diodes oriented to block current from flowing from node Y to node X) and a second series-connected group of LV switches Q6-Q8 oriented in a second direction (e.g., having body diodes oriented to block current from flowing from node X to node Y). By using two back-to-back groups of serially connected LV switches, first leg 502 may provide a high bidirectional voltage blocking capability between nodes X and Y and between nodes Y and X.

Second leg 503 may be connected in parallel to first leg 502 and may feature back-to-back (e.g., having connected anodes) HV switches Q4 and Q5. HV switches are connected back-to-back to provide a high bidirectional voltage blocking capability between nodes X and Y and between nodes Y and X.

Figure 6:
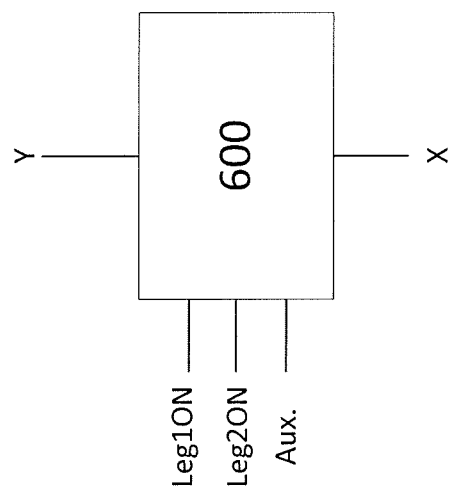
FIG. 6 is a block diagram according to one or more illustrative embodiments.

Reference is now made to FIG. 6, which shows an integrated switch circuit according to illustrative embodiments. Switch circuit 600 may be an integrated assembly (e.g., a PCB or a module) of switches Q1-Q4 of FIG. 1. Nodes X and Y may be externally available via externals terminals, the gate terminals of switches Q1-Q3 may be available via the Leg1ON terminal, and the gate terminal of switch Q4 may be available via the Leg2ON terminal. Terminals Leg1ON and Leg2ON may be coupled to suitable controller (e.g., a controller similar to or the same as controller 101 of FIG. 1). In some embodiments, a controller may be further integrated in switch circuit 600, with auxiliary power provided to the controller via auxiliary terminal Aux. Switches Q1-Q4 of FIG. 1 (along with other circuitry, for example, gate driver circuits) may be integrated using a single module package, or may be integrated as a fabrication structure (e.g., at a wafer level). Integrating components such as switches may provide lower cost, improved efficiency and increased ease-of-use. In some embodiments, an integrated controller may provide simpler control presented to a user. For example, the two terminals Leg1ON and Leg2ON may be unified to a single terminal for receiving simple logical ON/OFF command signals, and an internal controller may handle the timing configuration of FIG. 3.

In embodiments involving additional switches (e.g., switch Q5 of FIG. 4) or devices requiring control signals, switch circuit 600 may include additional terminals available for receiving control signals.

Embodiments disclosed herein employ switching legs having, for example, two or three MOSFETs connected in series. It is to be understood that other switches may be used instead of or in addition to MOSFETs, and any number of switches may be used. For example, eight 100V LVMs may be stacked to form an equivalent 800V switching leg connected in parallel to a leg having a 1200V IGBT. As another example, three 1200V IGBTs may be stacked to form an equivalent 3600V switching leg connected in parallel to a leg having a 3.3 kV SiCFET.

MOSFETs are used as examples of switches which come in low-voltage variants and high-voltage variants, and may be used to implement switches used to form switching circuits disclosed herein. Other types of switches may be used, such as bipolar junction transformers (BJTs), insulated gate bipolar transistors (IGBTs), gallium-nitride switches (GaNs), Silicon-Carbide switches (SiCs), and more.

For example, power BJTs or LV IGBTs may be used as LV switches Q1-Q3 of FIG. 1. Switch Q4 may be a superjunction MOSFET, a SiC switch or a GaN switch. Diode D1 of FIG. 2 may be a Schottky diode (e.g., for use in a low-voltage application), a silicon diode, a SiC diode, or a GaN Schottky diode.

As another example, switches Q1-Q3 of FIG. 1 may be thyristors, and switch Q4 may be an IGBT. In some embodiments, switches Q1-Q3 of FIG. 1 may be IGBTs and switch Q4 may be a SiC switch.

It is noted that various connections are set forth between elements herein. These connections are described in general and, unless specified otherwise, may be direct or indirect; this specification is not intended to be limiting in this respect. Further, elements of one embodiment may be combined with elements from other embodiments in appropriate combinations or subcombinations. For example, switch Q5 of FIG. 4 may replace diode D2 of FIG. 2.

The invention claimed is:

1. An apparatus comprising:
a first leg comprising a plurality of transistors connected in series between a first node and a second node, wherein each of the plurality of transistors comprises a respective body diode; and
a second leg connected between the first node and the second node and in parallel to the series connection of the plurality of transistors of the first leg, wherein the second leg comprises a first transistor, and wherein the second leg has lower reverse recovery losses relative to the first leg.

2. The apparatus of claim 1, wherein the first transistor of the second leg comprises a first body diode.

3. The apparatus of claim 2, wherein the second leg further comprises a second diode connected in series with the first transistor of the second leg, and
wherein the second diode is orientated in an opposite forward bias direction to the first body diode.

4. The apparatus of claim 2, wherein the second leg further comprises a second transistor connected in series with the first transistor of the second leg, and
wherein the second transistor comprises a second body diode oriented in an opposite forward bias direction to the first body diode.

5. The apparatus of claim 1, wherein the respective body diode of each of the plurality of transistors is oriented in a same forward bias direction.

6. The apparatus of claim 5, wherein the first leg further comprises a second transistor connected in series with the plurality of transistors, the second transistor comprising a first body diode, and wherein the first body diode is oriented in an opposite forward bias direction to the respective body diode of each of the plurality of transistors.

7. The apparatus of claim 6, wherein the first leg further comprises a third transistor connected in series with the plurality of transistors, wherein the third transistor comprises a second body diode, and wherein the second body diode is oriented in a same forward bias direction as the first body diode.

8. The apparatus of claim 1, further comprising a controller configured to:
transition the apparatus from a first non-conduction period to a conduction period by, after turning the first transistor of the second leg from an OFF state to an ON state, turning the plurality of transistors of the first leg from an OFF state to an ON state; and transition the apparatus from the conduction period to a second non-conduction period by, after turning the first transistor of the second leg from the ON state to the OFF state, turning the plurality of transistors of the first leg from the ON state to the OFF state.

9. The apparatus of claim 1, wherein the plurality of transistors comprise at least two metal-oxide-semiconductor field-effect transistors (MOSFETs), and wherein each MOSFET of the at least two MOSFETs is rated to 200 Volts or less.

10. The apparatus of claim 1, wherein the first transistor comprises a metal-oxide-semiconductor field-effect transistor (MOSFET) rated to at least 600 Volts.

11. A method comprising:
connecting a first leg between a first node and a second node, the first leg comprising a plurality of transistors connected in series, wherein each of the plurality of transistors comprises a respective body diode; and
connecting a second leg between the first node and the second node and in parallel to the plurality of transistors of the first leg, wherein the second leg comprises a first transistor, and wherein the second leg has lower reverse recovery losses relative to the first leg.

12. The method of claim 11, further comprising:
after turning the first transistor of the second leg from an OFF state to an ON state turning the plurality of transistors of the first leg from an OFF state to an ON state.

13. The method of claim 11, further comprising:
after turning the first transistor of the second leg from an ON state to an OFF state, turning the plurality of transistors of the first leg from an ON state to an OFF state.

14. The method of claim 11, wherein the first transistor of the second leg comprises a first body diode.

15. The method of claim 14, wherein the second leg further comprises a second diode connected in series with the first transistor of the second leg, and
wherein the second diode is oriented in an opposite forward bias direction to the first body diode.

16. The method of claim 14, wherein the second leg further comprises a second transistor connected in series with the first transistor of the second leg, and wherein the second transistor comprises a second body diode oriented in an opposite forward bias direction to the first body diode.

17. The method of claim 11, wherein the respective body diode of each of the plurality of transistors are oriented in a same forward bias direction.

18. The method of claim 17, wherein the first leg further comprises a second transistor connected in series with the plurality of transistors, the second transistor comprising a first body diode, and wherein the first body diode being oriented in an opposite forward bias direction to the respective body diode of each of the plurality of transistors.

19. The method of claim 18, wherein the first leg further comprises a third transistor connected in series with the plurality of transistors, wherein the third transistor comprises a second body diode, and wherein the second body diode is oriented in a same forward bias direction as the first body diode.

20. The method of claim 11, wherein the plurality of transistors of the first leg comprise at least two metal-oxide-semiconductor field-effect transistors (MOSFETs), each MOSFET of the at least two MOSFETs being rated to 200 Volts or less, and
wherein the first transistor of the second leg comprises a MOSFET rated to at least 600 Volts.

* * * * *